United States Patent
Shimizu et al.

(10) Patent No.: US 9,147,625 B2
(45) Date of Patent: Sep. 29, 2015

(54) THERMOSETTING RESIN SHEET FOR SEALING ELECTRONIC COMPONENT, RESIN-SEALED TYPE SEMICONDUCTOR DEVICE, AND METHOD FOR PRODUCING RESIN-SEALED TYPE SEMICONDUCTOR DEVICE

(71) Applicant: NITTO DENKO CORPORATION, Ibaraki-shi, Osaka (JP)

(72) Inventors: Yusaku Shimizu, Ibaraki (JP); Takeshi Matsumura, Ibaraki (JP); Eiji Toyoda, Ibaraki (JP); Tsuyoshi Torinari, Ibaraki (JP); Daisuke Uenda, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 13/973,863

(22) Filed: Aug. 22, 2013

(65) Prior Publication Data

US 2014/0061955 A1 Mar. 6, 2014

(30) Foreign Application Priority Data

Aug. 29, 2012 (JP) .................... 2012-189025

(51) Int. Cl.
*H01L 23/29* (2006.01)
*H01L 21/56* (2006.01)

(52) U.S. Cl.
CPC .............. *H01L 23/293* (2013.01); *H01L 21/56* (2013.01); *H01L 2924/0002* (2013.01); *Y10T 428/31663* (2015.04); *Y10T 428/31678* (2015.04)

(58) Field of Classification Search
CPC ............ H01L 2924/0665; H01L 33/56; H01L 21/565; H01L 2224/48997; H01L 23/4334
USPC .......... 257/783, 100, E33.056; 438/107, 113, 438/464
See application file for complete search history.

(56) References Cited

U.S. PATENT DOCUMENTS

| 4,615,853 A | * | 10/1986 | Aoyama et al. | 264/122 |
|---|---|---|---|---|
| 6,936,921 B2 | * | 8/2005 | Yoshida | 257/728 |
| 2003/0109623 A1 | * | 6/2003 | Gornowicz et al. | 524/492 |
| 2004/0140550 A1 | * | 7/2004 | Yoshida | 257/700 |

(Continued)

FOREIGN PATENT DOCUMENTS

| JP | 2000212393 A | 8/2000 |
|---|---|---|
| JP | 2002231755 A | 8/2002 |

(Continued)

OTHER PUBLICATIONS

Japanese Patent Office, Office Action Issued in Japanese Patent Application No. 2012-189025, Mar. 17, 2015, 8 pages.

(Continued)

*Primary Examiner* — Jaehwan Oh
(74) *Attorney, Agent, or Firm* — Alleman Hall McCoy Russell & Tuttle LLP

(57) ABSTRACT

A thermosetting resin sheet for sealing an electronic component, that is excellent in adhesiveness, onto the electric component; a resin-sealed type semiconductor device high in reliability; and a method for producing the device are provided. The present invention relates to a thermosetting resin sheet for sealing an electronic component, comprising one or more resin components, one of the components being allowable to be a thermoplastic resin, and having a content by percentage of the thermoplastic resin of 30% or less by weight of all of the entire resin components.

18 Claims, 1 Drawing Sheet

(56) References Cited

U.S. PATENT DOCUMENTS

| | | | |
|---|---|---|---|
| 2007/0225438 A1* | 9/2007 | Hasegawa et al. | 524/879 |
| 2008/0286562 A1* | 11/2008 | Toyoda et al. | 428/327 |
| 2009/0189300 A1* | 7/2009 | Kawakami et al. | 257/787 |
| 2011/0147954 A1 | 6/2011 | Kitamura | |
| 2011/0304016 A1* | 12/2011 | Nakamura et al. | 257/532 |
| 2012/0146039 A1* | 6/2012 | Gosain et al. | 257/59 |
| 2012/0153513 A1* | 6/2012 | Toyoda et al. | 257/793 |
| 2012/0263946 A1* | 10/2012 | Mitsukura et al. | 428/345 |
| 2013/0093105 A1* | 4/2013 | Kawakami et al. | 257/787 |
| 2013/0200364 A1* | 8/2013 | Tokunaga et al. | 257/43 |

FOREIGN PATENT DOCUMENTS

| | | |
|---|---|---|
| JP | 2003017623 A | 1/2003 |
| JP | 2006019714 A | 1/2006 |
| JP | 2007077179 A | 3/2007 |
| JP | 2007302771 A | 11/2007 |
| JP | 2008060523 A | 3/2008 |
| JP | 2008285593 A | 11/2008 |
| JP | 2012046657 A | 3/2012 |
| JP | 2012140566 A | 7/2012 |
| JP | 2012144661 A | 8/2012 |
| WO | 2010029726 A1 | 3/2010 |

OTHER PUBLICATIONS

Japanese Patent Office, Office Action Issued in Japanese Patent Application No. 2012-189025, Jan. 20, 2015, 6 pages.

* cited by examiner

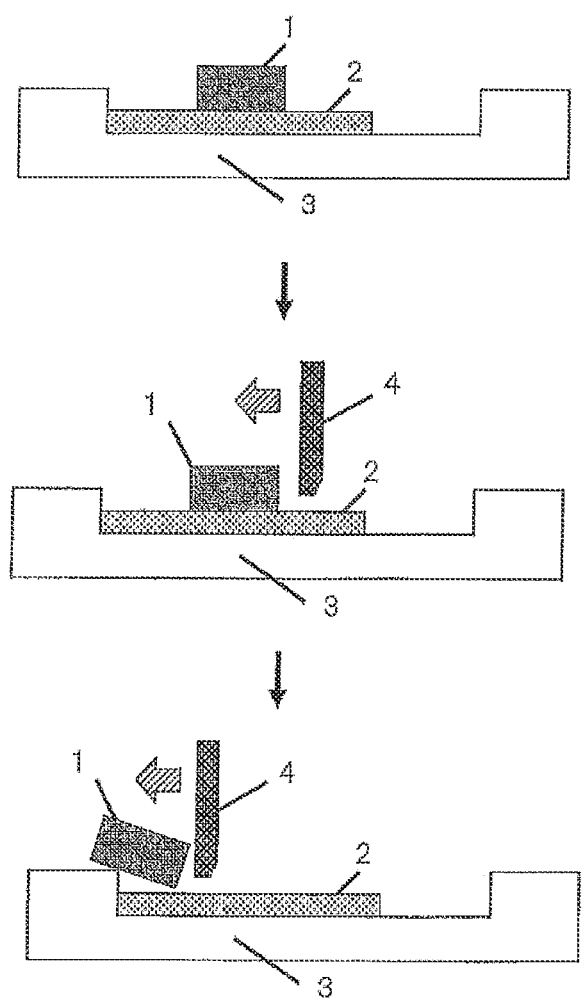

THERMOSETTING RESIN SHEET FOR SEALING ELECTRONIC COMPONENT, RESIN-SEALED TYPE SEMICONDUCTOR DEVICE, AND METHOD FOR PRODUCING RESIN-SEALED TYPE SEMICONDUCTOR DEVICE

BACKGROUND OF THE INVENTION

1. Field of the Invention

The present invention relates to a thermosetting resin sheet for sealing an electronic component, a resin-sealed type semiconductor device, and a method for producing a resin-sealed type semiconductor device.

2. Description of the Related Art

In the production of a semiconductor device, semiconductor chips are mounted onto an electric substrate that may be of various types, such as a lead frame or a circuit substrate, and subsequently the semiconductor chips, the electric substrate, and other electronic components are sealed with a resin to be covered therewith.

The resin sealing is performed for the protection of the semiconductor device from external stresses, moisture and contaminants, and other purposes. However, when the adhesiveness between the electronic components and the sealing resin is low, interfacial peeling off is easily caused and results in problems such as cracking of the package and breaking of bonding wires therein.

JP-A-2008-60523 describes a sealing film containing a resin component, a filler and a colorant that are each of a specified type, and having a resin layer having a flow quantity in the range of specified values. JP-A-2008-285593 describes a thermosetting type adhesive sheet for sealing, having a viscosity in the range of specified values at 80° C. to 120° C. before thermally set. However, according to JP-A-2008-60523 and JP-A-2008-285593, no sufficient investigations have been made about the adhesiveness about their electronic component(s) and their sealing resin.

SUMMARY OF THE INVENTION

In light of the problems, the present invention has been made. An object thereof is to provide a thermosetting resin sheet for sealing an electronic component that is excellent in adhesiveness onto the electric component; a resin-sealed type semiconductor device high in reliability; and a method for producing the device.

The present inventors have paid attention to the following: an ordinary silicon wafer is protected by a silicon nitride film; copper is widely used for wires or wiring members (such as a lead frame) of semiconductor devices; and a glass fabric based epoxy resin is widely used for respective substrates of semiconductor devices. The inventors have then found out that a thermoplastic resin is concerned with the adhesiveness of a resin sheet onto these adherends. The inventors also have found out that a resin-sealed type semiconductor device high in reliability can be obtained by setting the content by percentage of the thermoplastic resin in the sheet resin to a specified value or less, and adjusting the shear adhesive strength of the resin sheet onto each of these adherends at each of 25° C. and 260° C. into a specified range. Thus, the invention has been achieved.

Accordingly, the present invention relates to a thermosetting resin sheet for sealing an electronic component, comprising one or more resin components, one of the components being allowable to be a thermoplastic resin, and having a content by percentage of the thermoplastic resin of 30% or less by weight in the entire resin component (s), wherein after the resin sheet is bonded onto a silicon nitride film formed on a silicon wafer and then set, the resin sheet has a shear adhesive strength of 15 MPa or more at 25° C., and 2 MPa or more at 260° C., after the resin sheet is bonded onto a copper plate and then set, the resin sheet has a shear adhesive strength of 10 MPa or more at 25° C., and 0.5 MPa or more at 260° C., and after the resin sheet is bonded onto a glass fabric based epoxy resin substrate and then set, the resin sheet has a shear adhesive strength of 10 MPa or more at 25° C., and 1 MPa or more at 260° C.

According to the invention, the thermoplastic resin content by percentage is the specified value or less. Additionally, after the resin sheet is bonded to each of a silicon nitride on a silicon wafer, a copper plate, and a glass fabric based epoxy resin substrate and then set, the resin sheet has a shear adhesive strength at 25° C. in the above-mentioned range. For this reason, the resin sheet can achieve a good adhesiveness in a temperature band in which the resin-sealed type semiconductor device is usually used. Thus, the resin sheet can be prevented from undergoing interfacial peeling off. As a result, a resin-sealed type semiconductor device high in reliability can be obtained.

The content by percentage of the thermoplastic resin is the specified value or less and the shear adhesive strength at 260° C. is in the specified range; therefore, the resin sheet can be prevented from being peeled off by reflow when a package is produced using the resin sheet. As a result, a resin-sealed type semiconductor device high in reliability can be obtained.

The electronic-component-sealing thermosetting resin sheet is preferably produced by kneading extrusion.

In the resin sheet of the invention, the content by percentage of the thermoplastic resin is the specified value or less; thus, the raw material of the resin sheet is not easily shaped into a sheet form. However, by the production according to kneading extrusion, the raw material can easily be shaped into a sheet form.

The invention also relates to a resin-sealed type semiconductor device obtained by use of this resin sheet.

The invention also relates to a method for producing a resin-sealed type semiconductor device, including the step of using the resin sheet to seal an electronic component.

BRIEF DESCRIPTION OF THE DRAWING

FIG. 1 is a view illustrating a situation where the shear adhesive strength of a resin sheet is measured.

DETAILED DESCRIPTION OF THE PREFERRED EMBODIMENTS

The thermosetting resin sheet of the invention for sealing an electronic component is an electronic-component-sealing thermosetting resin sheet including one or more resin components. One of the resin components may be a thermoplastic resin. Furthermore, this resin sheet has a content by percentage of the thermoplastic resin of 30% or less by weight in the entire resin component (s). Additionally, regarding the resin sheet, after the resin sheet is bonded onto a silicon nitride film (SiN film) formed on a silicon wafer and then set, the resin sheet has a shear adhesive strength of 15 MPa or more at 25° C., and 2 MPa or more at 260° C.; after the resin sheet is bonded onto a copper plate and then set, the resin sheet has a shear adhesive strength of 10 MPa or more at 25° C., and 0.5 MPa or more at 260° C.; and after the resin sheet is bonded onto a glass fabric based epoxy resin substrate and then set, the resin sheet has a shear adhesive strength of 10 MPa or more at 25° C., and 1 MPa or more at 260° C.

The resin sheet of the invention usually contains an epoxy resin and a phenol resin. This manner makes it possible for the sheet to achieve a good thermosetting property.

The epoxy resin is not particularly limited, and examples thereof include triphenyl methane type epoxy resin, cresol novolak type epoxy resin, biphenyl type epoxy resin, modified bisphenol A type epoxy resin, bisphenol A type epoxy resin, bisphenol F type epoxy resin, modified bisphenol F type epoxy resin, dicyclopentadiene type epoxy resin, phenol novolak type epoxy resin, phenoxy resin, and other various epoxy resins. These epoxy resins may be used alone or in combination of two or more thereof.

The epoxy resin is preferably an epoxy resin which is in a solid form at room temperature, and has an epoxy equivalent of 150 to 250 and a softening point or melting point of 50° C. to 130° C. in order to certainly attain a desired toughness after curing and reactivity. Particularly preferred are triphenylmethane type epoxy resin, cresol novolak type epoxy resin, and biphenyl type epoxy resin from the viewpoint of the reliability.

The phenolic resin is not particularly limited as far as the resin causes a curing reaction with the epoxy resin. Examples thereof include phenol novolak resin, phenol aralkyl resin, biphenyl aralkyl resin, dicyclopentadiene type phenolic resin, cresol novolak resin, and resol resin. These phenolic resins may be used alone or in combination of two or more thereof.

The phenolic resin is preferably a resin having a hydroxyl equivalent of 70 to 250 and a softening point of 50° C. to 110° C. from the viewpoint of the reactivity thereof with the epoxy resin. The phenolic resin is in particular preferably phenol novolak resin because the resin is high in curing reactivity. Moreover, from the viewpoint of the reliability, the phenolic resin is a low-hygroscopicity phenolic resin such as phenol aralkyl resin, or biphenyl aralkyl resin can be preferably used.

Regarding the blend ratio between the epoxy resin and the phenolic resin, the entire amount of the hydroxyl groups in the phenolic resin is preferably from 0.7 to 1.5 equivalents, more preferably 0.9 to 1.2 equivalents per equivalent of epoxy groups in the epoxy resin from the viewpoint of the curing reactivity therebetween.

The total content by percentage of the epoxy resin and the phenol resin is preferably from 50% to 100% by weight of the entire resin component in the resin sheet. When the total content is 50% or more by weight, the resin sheet can achieve a good shear adhesive strength onto adherends (a silicon nitride film formed on a silicon wafer, a copper plate, and a glass fabric based epoxy resin substrate) at each of 25° C. and 260° C. The total content is preferably 55% or more by weight, more preferably 60% or more by weight, even more preferably 70% or more by weight. The total content is also preferably 90% or less by weight, more preferably 80% or less by weight.

The resin sheet of the invention may contain a thermoplastic resin. The content by percentage of the thermoplastic resin is 30% or less by weight of the entire resin component(s). When the sheet contains the thermoplastic resin, the sheet can achieve a good softness and flexibility.

When the content by percentage of the thermoplastic resin in the entire resin component(s) is 30% or less by weight thereof, the resin sheet can achieve a good shear adhesive strength onto adherends (a silicon nitride film formed on a silicon wafer, a copper plate, and a glass fabric based epoxy resin substrate) at each of 25° C. and 260° C. The content by percentage is more preferably 15% or less by weight. The lower limit of the content is not particularly limited. The lower limit is preferably 4% by weight, more preferably 8% by weight. When the limit is 4%, the resin sheet can achieve a flexibility so as not to be easily cracked and for improved handleability.

Examples of the thermoplastic resin include natural rubber, butyl rubber, isoprene rubber, chloroprene rubber, ethylene/vinyl acetate copolymer, ethylene/acrylic acid copolymer, ethylene/acrylic ester copolymer, polybutadiene resin, polycarbonate resin, thermoplastic polyimide resin, polyamide resins such as 6-nylon and 6,6-nylon, phenoxy resin, acrylic resin, saturated polyester resins such as PET and PBT, polyamideimide resin, and fluorine-containing resin. Other examples thereof include styrene/isobutylene/styrene block copolymer. These thermoplastic resins may be used alone or in combination of two or more thereof.

The softening point of the thermoplastic resin is preferably 120° C. or higher, more preferably 150° C. or higher. When the softening point is 120° C. or higher, the resin sheet can achieve a good shear adhesive strength onto adherends (a silicon nitride film formed on a silicon wafer, a copper plate, and a glass fabric based epoxy resin substrate) at 260° C. The softening point is preferably 190° C. or lower, more preferably 170° C. or lower.

The resin sheet of the invention preferably contains an inorganic filler. The inorganic filler is not particularly limited, and may be a filler that may be of a various type known in the prior art. Examples thereof include quartz glass, talc, silica (such as fused silica or crystalline silica), alumina, aluminum nitride, and silicon nitride powders.

It is preferred to use, among these examples, silica powder since the powder makes it possible to decrease the linear expansion coefficient of the set product. It is preferred to use, among species of silica powder, fused silica powder. Examples of the fused silica powder include spherical fused silica powder, and crushed fused silica powder. From the viewpoint of fluidity, spherical fused silica powder is particularly preferred. Among species of fused silica powder, preferred is a fused silica powder species having an average particle diameter of 10 μm to 30 μm. Particularly preferred is a fused silica powder species having an average particle diameter of 15 μm to 25 μm from the viewpoint of the thickness of the resin sheet, which has been shaped, and an estimated height of an electric component to be used.

The average particle diameter may be determined, for example, by measurement using a laser diffraction scattering type particle size distribution measuring device on a sample extracted arbitrarily from a population of the particles.

The content by percentage of the inorganic filler is preferably from 70% to 95% by weight, more preferably from 80% to 90% by weight, even more preferably from 85% to 90% by weight of the entire resin sheet. If the content of the inorganic filler is less than 70% by weight, the resin sheet is largely different in linear expansion coefficient from the electric component or the substrate, so that the resin sheet is unsuitable as a sealing agent therefor. Conversely, if the content of the inorganic filler is more than 95% by weight, it is feared that the raw material of the resin sheet cannot be made into a sheet-form resin because the material has a problem about the porosity thereof.

The resin sheet of the invention preferably contains a curing promoter. The curing promoter is not particularly limited as far as the promoter is an agent for promoting the curing. The curing promoter is preferably an organic phosphorous compound, such as triphenylphosphine or tetraphenylphosphonium tetraphenyl borate, or an imidazole compound from the viewpoint of curing-promotion performance and storability.

The content of the curing promoter is preferably from 0.1 parts to 5 parts by weight per 100 parts by weight of the resin components.

Other Components:

The resin sheet of the invention preferably contains a flame retardant component. This component makes it possible to prevent the following: the electric component is ignited, or the flammability thereof is increased by a short circuit of the component, or some other. The flame retardant component may be various metal hydroxides such as aluminum hydroxide, magnesium hydroxide, iron hydroxide, calcium hydroxide, tin hydroxide, or any complexed metal hydroxide. Preferred is aluminum hydroxide or magnesium hydroxide, and particularly preferred is aluminum hydroxide from the viewpoint of costs and an advantage that the metal hydroxide can exhibit flame retardancy in a relatively small addition amount thereof.

Besides the above-mentioned individual components, the resin sheet of the invention may appropriately contain other additives, such as carbon black or any other pigment, a silane coupling agent, and an adhesion promoter, if necessary.

The resin sheet of the invention may be produced by an ordinary method. Preferably, the resin sheet is produced by kneading extrusion. The resin sheet of the invention has a small thermoplastic-resin-content by percentage. Thus, the raw material thereof is not easily made into a sheet form. However, the raw material can easily be shaped by kneading extrusion. Moreover, the raw material can be made into a homogeneous sheet in which the volume of voids (air bubbles) is small.

The method for the production of the resin sheet by kneading extrusion is, for example, a method of using a known kneading machine, such as a mixing roll, a pressurized kneader or an extruder, to melt and knead the above-mentioned individual components, thereby preparing a kneaded product, and then processing the resultant kneaded product plastically to be shaped into a sheet form. Conditions for the kneading are as follows: the kneading temperature is preferably a temperature equal to or higher than the respective softening points of the individual components, and is, for example, from 30° C. to 150° C. When the thermosetting property of the epoxy resin is considered, the temperature is preferably from 40° C. to 140° C., more preferably from 60° C. to 120° C. The period is, for example, from 1 to 30 minutes and is preferably from 5 to 15 minutes. Through this process, the kneaded product can be prepared.

The resultant kneaded product is shaped by extrusion, whereby the resin sheet can be yielded. Specifically, after the melting and kneading, the kneaded product is extruded in the state of being kept at the high temperature state without being cooled, whereby the resin sheet can be formed. The method for the extrusion is not particularly limited, and examples thereof include T-die extrusion, roll rolling, roll kneading, co-extrusion, and calender forming methods. The extruding temperature is preferably equal to or higher than the respective softening points of the individual components. When the thermosetting property and the formability of the epoxy resin are considered, the temperature is, for example, from 40° C. to 150° C., preferably from 50° C. to 140° C., even more preferably from 70° C. to 120° C. By the above-mentioned operations, the resin sheet of the invention can be formed.

The thus yielded resin sheet may be used in the form of a single-layered structure. Alternatively, this resin sheet, and one or more resin sheets equivalent thereto may be used in the form of a multi-layered structure in which these resin sheets, the number of which is two or more, are laminated onto each other.

Regarding the resin sheet of the invention, after the resin sheet is bonded onto a silicon nitride film formed on a silicon wafer and then set, the resin sheet has a shear adhesive strength of 15 MPa or more at 25° C. When the shear adhesive strength is 15 MPa or more, the resin sheet can achieve a good adhesiveness onto the silicon nitride film in a temperature band in which the resin-sealed type semiconductor device is usually used. Thus, a resin-sealed type semiconductor device high in reliability can be obtained. The upper limit of the shear adhesive strength is not particularly limited, and is preferably, for example, 24 MPa.

Regarding the resin sheet of the invention, after the resin sheet is bonded onto a silicon nitride film formed on a silicon wafer and then set, the resin sheet has a shear adhesive strength of 2 MPa or more at 260° C. When the shear adhesive strength is 2 MPa or more, the resin sheet can be prevented from being peeling off in a reflow step when a package is produced using the resin sheet. Thus, a resin-sealed type semiconductor device high in reliability can be obtained. The upper limit of the shear adhesive strength is not particularly limited, and is preferably, for example, 4 MPa.

Regarding the resin sheet of the invention, after the resin sheet is bonded onto a copper plate and then set, the resin sheet has a shear adhesive strength of 10 MPa or more at 25° C. When the shear adhesive strength is 10 MPa or more, the resin sheet can achieve a good adhesiveness onto the copper-plate in a temperature band in which the resin-sealed type semiconductor device is usually used. The upper limit of the shear adhesive strength is not particularly limited, and is preferably, for example, 22 MPa.

Regarding the resin sheet of the invention, after the resin sheet is bonded onto a copper plate and then set, the resin sheet has a shear adhesive strength of 0.5 MPa or more at 260° C. When the shear adhesive strength is 0.5 MPa or more, the resin sheet can be prevented from being peeling off in a reflow step when a package is produced using the resin sheet. Thus, a resin-sealed type semiconductor device high in reliability can be obtained. The upper limit of the shear adhesive strength is not particularly limited, and is preferably, for example, 2.5 MPa.

Regarding the resin sheet of the invention, after the resin sheet is bonded onto a glass fabric based epoxy resin substrate and then set, the resin sheet has a shear adhesive strength of 10 MPa or more at 25° C. When the shear adhesive strength is 10 MPa or more, the resin sheet can achieve a good adhesiveness onto the glass fabric based epoxy resin substrate in a temperature band in which the resin-sealed type semiconductor device is usually used. The upper limit of the shear adhesive strength is not particularly limited, and is preferably, for example, 22 MPa.

Regarding the resin sheet of the invention, after the resin sheet is bonded onto a glass fabric based epoxy resin substrate and then set, the resin sheet has a shear adhesive strength of 1 MPa or more at 260° C. When the shear adhesive strength is 1 MPa or more, the resin sheet can be prevented from being peeling off in a reflow step when a package is produced using the resin sheet. Thus, a resin-sealed type semiconductor device high in reliability can be obtained. The upper limit of the shear adhesive strength is not particularly limited, and is preferably, for example, 3 MPa.

In the invention, the shear adhesive strength of any film is measured by a method described in Examples.

The resin sheet of the invention is usable to seal a semiconductor (such as a silicon wafer or silicon chip) on which a silicon nitride film is formed, a copper plate (such as a lead frame), a glass fabric based epoxy resin substrate (such as an FR-4), a condenser, a resistor, and other electric components.

The resin sheet is in particular preferably usable to seal at least one selected from the group consisting of a semiconductor on which a silicon nitride film is formed, a copper plate, and a glass fabric based epoxy resin substrate.

The method for the sealing is not particularly limited, and may be any sealing method known in the prior art. When the resin sheet of the invention is used to seal, for example, a wire bond type device, the method is, for example, a method of putting the resin sheet onto the wire bond type device, and applying heat and pressure to the resultant workpiece to seal its electronic component(s). By such a method, a resin-sealed type semiconductor device is yielded.

EXAMPLES

The present invention is explained in detail with reference to the examples below. However, the present invention is not limited to the following examples, and includes variations of these examples as long as their purpose is not frustrated. "Part (s)" in each example is on a weight basis as long as there is no special notation to indicate otherwise.

The following describes each component used in the examples:
Epoxy resin: YSLV-80XY (bisphenol F type epoxy resin) manufactured by Nippon Steel Chemical Co., Ltd.
Phenol resin: MEH7851SS (phenol biphenylene) manufactured by Meiwa Plastic Industries, Ltd.
Elastomer: SIBSTER 072T (polystyrene/polyisobutylene resin; softening point: 150° C. to 170° C.) manufactured by Kaneka Corp.
Spherical fused silica: FB-9454FC (54-μm-cut fused spherical silica; average particle diameter: 20 μm) manufactured by Denki Kagaku Kogyo K.K.
Silane coupling agent: KBN-403 (3-glycidoxypropyltrimethoxysilane) manufactured by Shin-Etsu Chemical Co., Ltd.
Carbon black: #20 manufactured by Mitsubishi Chemical Corp.
Flame retardant: FP-100 (phosphonitrilic acid phenyl ester) manufactured by Fushimi Pharmaceutical Co., Ltd.
Catalyst: 2PHZ-PW (imidazole based catalyst) manufactured by Shikoku Chemicals Corp.

Adherends used in the examples are described.
Silicon nitride film: a silicon wafer on which a silicon nitride film was formed (processed product manufactured by Tohnic Co., Ltd.; film thickness: 3000 Å±10%; total thickness: 370 μm±25 μm)
Copper plate: a product, ND-002 (Cu), manufactured by Dai Nippon Printing Co., Ltd.
FR-4 plate: a Glass Epoxy Multi (FR-4) R-1766 plate, manufactured by Panasonic Corp. (a glass fabric based epoxy resin substrate)

Production of Each Resin Sheet

Examples and Comparative Examples

In accordance with each blend ratio shown in Table 1, individual components were mixed with each other and kneaded at 60° C. to 120° C. for 10 minutes, using a biaxial kneader. In this way, each kneaded product was prepared. Next, the kneaded product was extruded and shaped to yield a resin sheet having a thickness of 0.8 mm.

The resultant resin sheet was used and evaluated as described below. The results are shown in Table 1.
<Measurement of Shear Adhesive Strength to Each Adherend>
Formation of Each Test Piece:

Each of the resin sheets was punched out into a circle having a diameter of 3 mm. The resultant circular resin sheet was used, and pressed onto each of the adherends in a temperature range (100° C.) permitting the viscosity thereof to be 1000 Pa-s or less until the thickness of the resin sheet was turned to about 0.7 mm by means of a flat plate press. The pressed resin sheet was then set at 150° C. for 1 hour. In this way, a test piece was yielded in which the resin sheet was bonded onto the adherend to be set.
Measurement:

FIG. 1 is a view illustrating a situation where the shear adhesive strength of the test piece was measured. As illustrated in FIG. 1, the test piece, which was a test piece in which a resin sheet 1 was bonded onto an adherend 2 to be set, was set onto a heatable sample table 3. The test piece was then adsorbed. A test tool 4 was suspended from the upper surface of the adherend 2 by 0.1 mm. The resin sheet 1 was pushed at a shift speed of 0.2 mm/s in a direction parallel to the bonded surfaces of the adherend 2 and the resin sheet 1 therebetween. The load at this time was measured.

The measurement was made in the state that the resin sheet 1 was kept at each of 25° C. and 260° C.

At the 260° C. measurement, the test piece was set on the sample table 3 of 260° C. temperature and then kept on standby for 30 seconds to cause heat to be conducted to the resin sheet 1 of the test piece.

A resin damage on the resin sheet 1 was measured, and the area (mm$^2$) thereof was calculated.
Calculation:

The shear adhesive strength was calculated in accordance with the following equation:

Shear load (N)/area (mm$^2$)=shear adhesive strength (MPa)

TABLE 1

|  |  | Example 1 | Example 2 | Comparative Example 1 |
|---|---|---|---|---|
| Ratio between blend amounts (parts by weight) | Epoxy resin | 3.4 | 4.9 | 2.9 |
|  | Phenol resin | 3.6 | 5.1 | 3.1 |
|  | Elastomer | 3.0 | — | 4.0 |
|  | Spherical fused silica | 87.9 | 87.9 | 88.0 |
|  | Silane coupling agent | 0.1 | 0.1 | — |
|  | Carbon black | 0.1 | 0.1 | 0.1 |
|  | (Organic) flame retardant | 1.8 | 1.8 | 1.8 |
|  | Catalyst | 0.1 | 0.1 | 0.1 |
|  | Total | 100.0 | 100.0 | 100.0 |
| Shear adhesive strength (MPa) | Silicon nitride film (measured at 25° C.) | 19.7 | 21.9 | 12.9 |

TABLE 1-continued

|  | Example 1 | Example 2 | Comparative Example 1 |
|---|---|---|---|
| Silicon nitride film (measured at 260° C.) | 2.3 | 2.7 | 2.1 |
| Copper plate (measured at 25° C.) | 13.4 | 18.4 | 8.1 |
| Copper plate (measured at 260° C.) | 0.8 | 1.3 | 1.1 |
| FR-4 (measured at 25° C.) | 14.9 | 17.0 | 9.0 |
| FR-4 (measured at 260° C.) | 2.3 | 1.3 | 2.8 |

DESCRIPTION OF THE REFERENCE NUMERALS

1 Resin sheet
2 Adherend
3 Sample table
4 Test tool

What is claimed is:

1. A thermosetting resin sheet for sealing an electronic component, comprising one or more resin components and an inorganic filler, wherein one of the resin components is a thermoplastic resin, and the thermosetting resin sheet has a content by percentage of the thermoplastic resin of a nonzero percentage which is not more than 30% by weight of all of the resin components,
   wherein a content by percentage of the inorganic filler is from 70% to 95% by weight of the thermosetting sheet,
   wherein after the thermosetting resin sheet is bonded onto a silicon nitride film formed on a silicon wafer and then set, the thermosetting resin sheet has a shear adhesive strength of 15 MPa or more at 25° C., and 2 MPa or more at 260° C.,
   wherein after the thermosetting resin sheet is bonded onto a copper plate and then set, the thermosetting resin sheet has a shear adhesive strength of 10 MPa or more at 25° C., and 0.5 MPa or more at 260° C.,
   wherein after the thermosetting resin sheet is bonded onto a glass fabric based epoxy resin substrate and then set, the thermosetting resin sheet has a shear adhesive strength of 10 MPa or more at 25° C., and 1 MPa or more at 260° C., and
   wherein the thermosetting resin sheet further comprises a curing promoter.

2. The thermosetting resin sheet according to claim 1, which is produced by kneading extrusion.

3. A resin-sealed type semiconductor device, obtained by use of the thermosetting resin sheet recited in claim 1.

4. A method for producing a resin-sealed type semiconductor device, comprising the step of using the thermosetting resin sheet recited in claim 1 to seal an electronic component.

5. The thermosetting resin sheet according to claim 1, wherein the one or more resin components comprise an epoxy resin.

6. The thermosetting resin sheet according to claim 1, wherein the one or more resin components comprise a phenol resin.

7. The thermosetting resin sheet according to claim 1, wherein the one or more resin components comprise an epoxy resin and a phenol resin,
   wherein a total content by percentage of the epoxy resin and the phenol resin is from 50% to 100% by weight of all of the resin components.

8. The thermosetting resin sheet according to claim 1, wherein the one of the resin components is the thermoplastic resin.

9. The thermosetting resin sheet according to claim 8, wherein a content by percentage of the thermoplastic resin is not more than 15% by weight of all of the resin components.

10. The thermosetting resin sheet according to claim 8, wherein the thermoplastic resin comprises styrene/isobutylene/styrene block copolymer.

11. The thermosetting resin sheet according to claim 8, wherein a softening point of the thermoplastic resin is 120° C. or higher.

12. The thermosetting resin sheet according to claim 8, wherein a softening point of the thermoplastic resin is 150° C. or higher.

13. The thermosetting resin sheet according to claim 8, wherein a softening point of the thermoplastic resin is 190° C. or lower.

14. The thermosetting resin sheet according to claim 8, wherein a softening point of the thermoplastic resin is 170° C. or lower.

15. The thermosetting resin sheet according to claim 1, wherein the content by percentage of the inorganic filler is from 80% to 90% by weight of the thermosetting resin sheet.

16. The thermosetting resin sheet according to claim 1, wherein the content by percentage of the inorganic filler is from 85% to 90% by weight of the thermosetting resin sheet.

17. The thermosetting resin sheet according to claim 1, wherein the curing promoter is present in an amount that is 0.1 to 5.0 parts by weight per 100 parts by weight of all of the resin components.

18. The thermosetting resin sheet according to claim 10, wherein a softening point of the styrene/isobutylene/styrene block copolymer is 120° C. or higher.

* * * * *